USOO5832414A

United States Patent [19] [11] Patent Number: 5,832,414
Hart et al. [45] Date of Patent: Nov. 3, 1998

[54] GENERATOR PROTECTION SYSTEM AND METHOD OF COMPENSATING FOR ERRORS IN PHASOR ESTIMATION DUE TO OSCILLATIONS IN DISCRETE FOURIER TRANSFORM

[75] Inventors: David G. Hart; James D. Stoupis, both of Raleigh; Damir Novosel, Cary, all of N.C.

[73] Assignee: ABB Power T&D Company Inc., Raleigh, N.C.

[21] Appl. No.: 939,932

[22] Filed: Sep. 29, 1997

Related U.S. Application Data

[63] Continuation-in-part of Ser. No. 574,357, Dec. 18, 1995, Pat. No. 5,721,689.
[51] Int. Cl.$^6$ .......................... G01R 23/10; G01R 23/16
[52] U.S. Cl. ................................ 702/77; 702/75; 702/76; 702/66; 702/112; 341/123; 324/76.28; 324/76.55; 324/76.47; 324/76.48
[58] Field of Search .................................. 702/75–77, 64, 702/66; 364/528.21; 341/123; 356/350; 324/76.11, 76.21, 76.28, 76.35, 76.44, 76.47, 76.55, 76.68

[56] References Cited

PUBLICATIONS

D. Hart and J. Stoupis, Protection Algorithms for the GPU, Task Report III, ABB Transmission Technology Institute Task Report, PSC 96–R–0035, Sep. 17, 1996.
D. Hart, Y. Hu, and D. Novosel, Protection Algorithms for the GPU, Task Report I, ABB Transmission Technology Institute Task Report PSC 95–R–0013, Mar. 24, 1995.
D. Hart et al., A New Frequency Tracking and Phasor Estimation Algorithm for Generator Protection, IEEE Transactions on Power Delivery, vol. 12, No. 3, Jul. 1997.
"Field Experience with a Digital Relay for Synchronous Generators,"89 SM 731–1 PWRD. [cited in parent case 08/574,357, filed Dec. 18, 1995].
"Performance Assessment of A new Digital Subsystem for Generator Protection", Presented on Oct. 13–14, 1994 [cited in parent case 08/574,357, filed Dec. 18, 1995].

"A New Measurement Technique for Tracking Voltage Phasors,Local System Frequency, and Rate of Change of Frequency," IEEE Transactions on Power Apparatus and Systems, vol. PAS 102, No. 5, May, 1983. [cited in parent case 08/574,357, filed Dec. 18, 1995].

"An Adaptive Sampling–Interval Generator for Digital Relaying," IEEE Transactions on Power Delivery, vol. 4, No. 3, Jul., 1989. [cited in parent case 08/574,357, filed Dec. 18, 1995].

*Primary Examiner*—Emanuel Todd Voeltz
*Assistant Examiner*—Cuong H. Nguyen
*Attorney, Agent, or Firm*—Woodcock Washburn Kurtz Mackiewicz & Norris LLP

[57] ABSTRACT

A new method of compensating for errors in phasor estimation due to oscillations caused by discrete fourier transforms used to estimate signal frequency is provided. The method uses a variable N-point DFT to compute one or more phasors based on data acquired from one or more sampled signals. At each sampling interval the change in phasor angle between the current sampling interval and the previous sampling interval is determined and used to estimate the instantaneous frequency of the signal. A non-oscillating phasor indicative of the instantaneous magnitude, angular frequency, and phase angle of the signal is generated based on the instantaneous frequency estimate. Instantaneous frequencies are averaged over a cycle of the signal to generate an average cycle frequency. In addition, a number of discrete frequencies and corresponding DFT windows based on a fixed sampling rate and a predetermined fundamental frequency of the signal are defined and used in estimating the instantaneous frequency. The DFT window is adjusted by setting it equal to the DFT window corresponding to the discrete frequency closest to the average cycle frequency. A generator protection system analyzing voltage and current signals output from a generator is also provided. The voltage and current signals are monitored by respective voltage and current sensors to produce a plurality of signals representative of voltage and current characteristics of the generator. The system comprises components for receiving and sampling signal input, and for processing the samples according to the inventive method.

15 Claims, 7 Drawing Sheets

GENERATOR PROTECTION SYSTEM AND METHOD OF COMPENSATING FOR ERRORS IN PHASOR ESTIMATION DUE TO OSCILLATIONS IN DISCRETE FOURIER TRANSFORM

RELATED APPLICATION

This is a continuation-in-part of copending application Ser. No. 08/574,357 filed Dec. 18, 1995 now U.S. Pat. No. 5,721,689 issued on Feb. 24, 1998.

FIELD OF THE INVENTION

The present invention relates to frequency tracking and phasor estimation in digital systems, and more particularly, to a generator protection system and a new method of compensating for errors in phasor estimation due to oscillations caused by discrete fourier transforms used to estimate signal frequency.

BACKGROUND OF THE INVENTION

Digital protection systems are used, for example, in power systems to monitor the voltage and current signals provided by electrical generators. Such digital protection systems may be embodied in a generator protection unit (GPU). A GPU estimates voltage and current phasors based upon the voltage and current signals and from those phasors detect various fault conditions requiring system shut down. The phasors are also used for metering functions performed by remote users and for other power system control functions. Abnormal conditions may additionally be detected through relatively large changes in the generator's operating frequency. Accordingly, an adaptive technique for tracking the generator frequency is important for both generating accurate voltage and current phasors and for monitoring fault conditions in the generator by detecting a significant change in the generator frequency.

While the present invention will be described in the context of a GPU implementation, those of ordinary skill in the art will readily understand that the inventive techniques described herein may be implemented in a variety of systems in which signal phasors are generated and accurate adaptive frequency tracking is required.

Figure 1:
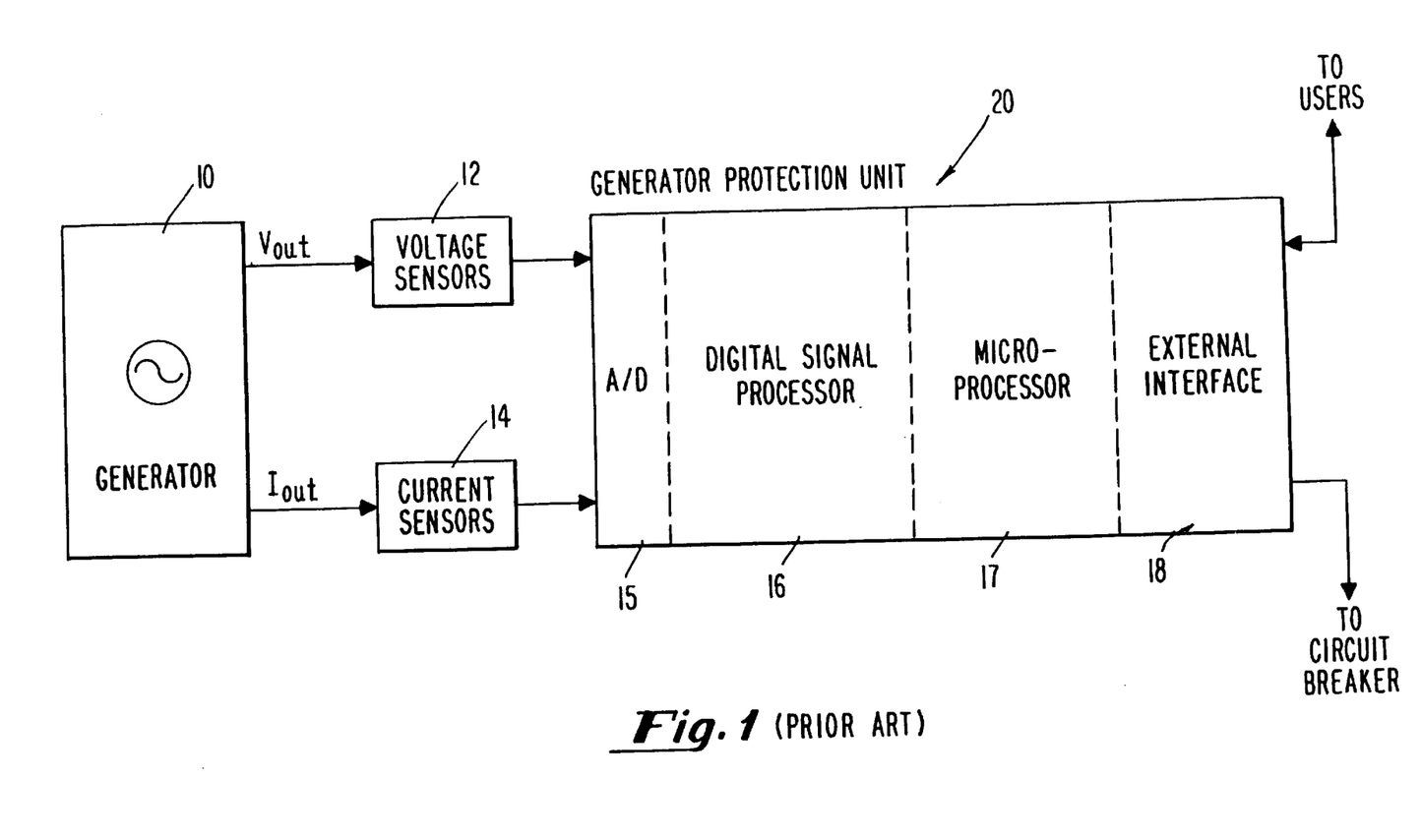
FIG. 1 shows a block diagram of a generator protection system.

FIG. 1 shows a GPU 20 and a generator 10. Voltage signals output from the generator ($V_{out}$) are sensed by voltage sensor 12. Potential transformers, resistive dividers, or the like, may be employed as voltage sensors. The sensed voltage signals are output from the voltage sensor to the GPU 20. It should be understood that the generator produces three-phase power, and accordingly, the voltage signals output from the generator may include $v_A$, $v_B$, and $v_C$, or alternatively may include line-to-line voltages $v_{AB}$, $v_{BC}$, and $V_{CA}$.

Current sensor 14 such as current transformers, may be used to sense current signals output from the generator ($I_{out}$) to both the GPU and the power system. If, for example, the current output to the GPU and to the power system are not equal then a fault condition may exist. The sensed currents, which may include each line current $i_A$, $i_B$, and $i_C$, is provided as input to the GPU 20.

The GPU 20 includes A/D converter 15, digital signal processor (DSP) 16, microprocessor 17, and external interface 18. The A/D converter samples the sensed voltage and current signals and provides voltage and current samples to the DSP. The DSP may generate a voltage phasor each sampling interval by utilizing a discrete fourier transform (DFT) to be described in more detail below, and then tracks the operating frequency of the generator based on the generated phasors. Phasor data and frequency estimates are output from the DSP to the microprocessor.

The microprocessor uses this information to detect faults in the power system or generator malfunctions. If a fault or malfunction is detected the microprocessor outputs a signal through the external interface to a circuit breaker causing the circuit breaker to open its current carrying contacts so that the system is effectively shut down.

Users may wish to access the phasor and frequency estimates. For example, engineers may be required to monitor system performance for a variety of reasons. Accordingly, the phasor data and frequency estimates may be output from the DSP and stored by the microprocessor in a memory (not shown). If the data is then needed, it may be accessed by the user upon request which may be transmitted to the microprocessor via the external interface. The external interface may include an RS232 interface. The microprocessor transfers the stored data from the memory to the user via the external interface.

While other techniques may be used to generate the phasor data, the DFT is commonly used because it is very efficient in estimating a particular frequency. Consider the waveform s(t) given by:

$$s(t) = B\cos(wt + \gamma) \quad (1)$$

Then, sampling at N samples per cycle, the waveform is given by:

$$S_k = S(t_k) = B\cos(\omega t_k + \gamma) = B\cos\left(\frac{2\pi}{N}k + \gamma\right) = B\cos(\psi k + \gamma). \quad (2)$$

where $\psi$ is defined as $2\pi/N$ and the samples of $s(t_k)$ are:

$$S_0 = S(t_0) = B\cos(\omega t_0 + \gamma) = \frac{B}{2}[e^{j(0\cdot\psi)}e^{j\gamma} + e^{-j(0\cdot\psi)}e^{-j\gamma}] \quad (3)$$

$$S_1 = S(t_1) = B\cos(\omega t_1 + \gamma) = \frac{B}{2}[e^{j(1\cdot\psi)}e^{j\gamma} + e^{-j(1\cdot\psi)}e^{-j\gamma}] \quad (4)$$

.
.
.

$$S_{N-1} = S(t_{N-1}) = B\cos(\omega t_{N-1} + \gamma) = \frac{B}{2}[e^{j((N-1)\cdot\psi)}e^{j\gamma} + e^{-j((N-1)\cdot\psi)}e^{-j\gamma}] \quad (5)$$

Multiplying each sample by corresponding $e^{-j(k\psi)}$ (k=0,N−1) and summing, then rearranging, results in the DFT formula given by:

$$Be^{2j\gamma} = \frac{2}{N}\sum_{K=0}^{N-1}S_k e^{-j(k\psi)} \quad (6)$$

Note that the rms value requires division by a factor of the square root of 2.

The above description of the DFT assumes an integer samples per cycle N, resulting in a sampling frequency $f_s = (N \cdot f)$, where f is the fundamental frequency, e.g., the expected operating frequency of the generator when fully energized. The fundamental frequency is related to the DFT window and may be an assumed value. With a sampling frequency of 60×32 Hz, the DFT calculation with a 32 sample window will have a fundamental frequency of 60 Hz. For the same Δt, a window of N=22 samples, the DFT fundamental frequency is 87.27 Hz. Thus, the sampling frequency is an integer multiple of the fundamental frequency. The actual generator frequency varies from the DFT fundamental frequency by an amount $\Delta f$. Application of the DFT when $f_s$ is not an integer of the fundamental will introduce an "error" in the phasor estimate. This error is used to estimate the actual frequency using the deviation from fundamental frequency.

Considering the signal defined by equation (1) where $\omega$ is defined as $2\pi(f+\Delta f)$, and $f_s=(f \cdot N)$. Applying the DFT equation results in:

$$DFT = \frac{2}{N} \sum_{k=0}^{N-1} S_k e^{-j(k\varphi)} = Be^{j\gamma} \frac{\sin\left(\frac{\pi \Delta f}{f}\right)}{N\sin\left(\frac{\pi \Delta f}{fN}\right)} e^{j\left(\frac{\pi \Delta f}{f} - \frac{\pi \Delta f}{fN}\right)} + \quad (7)$$

$$Be^{-j\gamma} \frac{\sin\left(\frac{\pi \Delta f}{f}\right)}{N\sin\left(\frac{\pi \Delta f}{fN} + \frac{2\pi}{N}\right)} e^{j\left(-\frac{\pi \Delta f}{f} + \frac{\pi \Delta f}{fN} + \frac{2\pi}{N}\right)}$$

Figure 2:
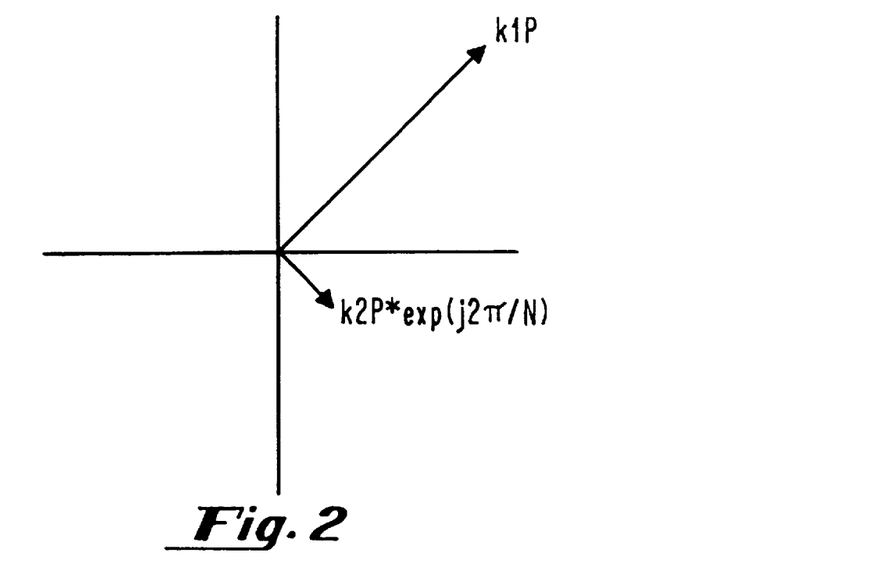
FIG. 2 shows an exemplary phasor diagram.

From the above equation, it is easy to determine that if the input signal is at frequency f, then $\Delta f$ is zero and the equation simplifies to equation (6). It is also important to note that $\gamma$ is the offset angle and will vary depending on when the DFT estimate begins. Therefore, equation (7) can be expressed as follows:

$$DFT = \frac{2}{N} \sum_{k=0}^{N-1} S_k e^{-j(k\varphi)} = k_1 P + k_2 P^* e^{j\left(\frac{2\pi}{N}\right)} \quad (8)$$

where $$k1 = \frac{\sin\left(\frac{\pi \Delta f}{f}\right)}{N\sin\left(\frac{\pi \Delta f}{fN}\right)}, \; k2 = \sin\frac{(\pi \Delta f)}{N\sin\left(\frac{\pi \Delta f}{fN} + \frac{2\pi}{N}\right)}, \; P = \quad (9)$$

$$Be^{j\gamma}e^{j\left(\frac{\pi \Delta f}{f} - \frac{\pi \Delta f}{fN}\right)}$$

and where P is the complex phasor and P* is the complex conjugate of P. An exemplary phasor diagram is shown in FIG. 2. Note that each phasor is indicative of the instantaneous magnitude, angular frequency and phase of the signal at the time of sampling.

For frequency estimation, the input signal is assumed to be at the fundamental frequency f. The actual generator frequency is determined by computing $\Delta f$, then adjusting the frequency estimate.

A simplification of equations (7) and (8) may be used for the estimation of the frequency. If the frequency deviation is small, then $\sin(\theta)$ approaches $\theta$. Under this condition, equations (7) and (8) simplify to:

$$DFT = \frac{2}{N} \sum_{k=0}^{N-1} S_k e^{-j(k\varphi)} \approx Be^{j\gamma} \frac{\frac{\pi \Delta f}{f}}{N\frac{\pi \Delta f}{fN}} e^{j\left(\frac{\pi \Delta f}{f} - \frac{\pi \Delta f}{fN}\right)} + 0 = \quad (10)$$

$$Be^{j\gamma}e^{j\left(\frac{\pi \Delta f}{f} - \frac{\pi \Delta f}{fN}\right)}$$

Figure 3:
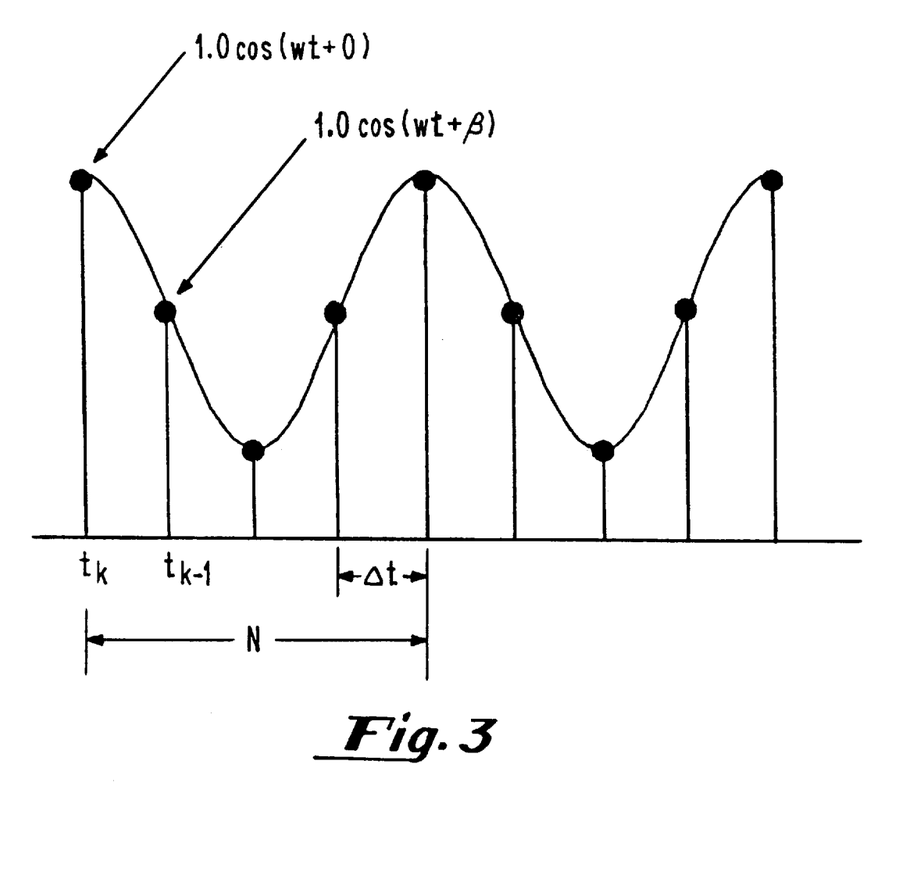
FIG. 3 shows the sampled waveform of a signal having a cosine waveform.

In the above equation, the values of N and f are known. $\Delta f$ is an unknown which must be determined to calculate the actual operating frequency. FIG. 3 shows the sampled waveform of the signal represented by equation (1). The cosine waveform has an offset angle of 0 degrees when sampled at instant $t_k$. Using the previous cycle of data, the DFT is computed according to equation (10). A new sample is acquired at instant $t_{k+1}$ when the waveform has a new offset angle $\beta$. The offset angle between two consecutive samples (shown in FIG. 3) is given by:

$$\beta = e^{j}\left(\frac{2\pi(f+\Delta f)}{fN}\right) \quad (11)$$

Thus, the ratio of two consecutive DFT estimates is given by:

$$\frac{DFT(t_k+1)}{DFT(t_k)} = \frac{Be^{j\gamma}e^{j\left(\frac{\pi \Delta f}{f} - \frac{\pi \Delta f}{fN}\right)}e^{j\left(\frac{2\pi(f+\Delta f)}{fN}\right)}}{Be^{j\gamma}e^{j\left(\frac{\pi \Delta f}{f} - \frac{\pi \Delta f}{fN}\right)}} \quad (12)$$

Ignoring the magnitude and examining the argument yields:

$$arg\left(\frac{DFT(t_k+1)}{DFT(t_k)}\right) = \theta = \frac{2\pi(f+\Delta f)}{fN} \quad (13)$$

By determining the DFT at different points in time, the angle difference from the two DFT estimates can be used to compute the actual operating frequency given by $f+\Delta f$. Solving equation (13) for $f+\Delta f$ yields:

$$f+\Delta f = \theta \cdot fN/2\pi \quad (14)$$

One known technique for tracking the generator frequency is to track the frequency, then adjust the sampling rate in order to maintain a fixed number of samples per cycle. Thus, if the GPU acquired 12 samples per 60 Hz cycle, the sampling interval, $\Delta t$, would be 1.388 msecs. If the frequency changed to 30 Hz, the sampling interval, $\Delta t$, would be adjusted to 2.77 msecs. However, the DFT window N would remain unchanged.

While this technique provides reasonably good frequency tracking capabilities using a simple N-point DFT and thus only requires a single set of DFT coefficients, it also has numerous disadvantages and shortcomings. For example, the variable DFT window requires an adjustable sampling rate that can be costly and relatively complex to implement through a variable A/D sampling circuit. Moreover, all of the data and samples must be stored noting the variable sampling interval along with the variable DFT window used to compute the phasor data thereby complicating the system's storage and display requirements as well as adding complexity to the data analysis and manipulation.

Still further, while this technique limits the effects of transients it still tracks the transients causing unnecessary error in the frequency estimates. Specifically, if a transient occurs during a single cycle, the frequency estimate is adjusted by ±5 Hz — a relatively large adjustment. If during the next cycle, the transient has dissipated, frequency tracking is resumed based on an estimated frequency containing a relatively large error. Moreover, if the transient persists for several cycles, then it may seriously degrade frequency tracking once the transient has substantially subsided.

Additionally, this technique does not provide adequate harmonic rejection. Thus frequency estimates associated with harmonics in the sampled signals may result in the aforementioned adjustments associated with transients. The effects of large adjustments associated with harmonics may be profound while the generator is ramping up to its normal operating frequency.

Importantly, if this technique fails to track the frequency properly the varying sampling interval, $\Delta t$, can exceed a critical interval such that required sampling data is missed. Thus time-domain back up functions may be ineffective or impossible to implement using this frequency tracking technique.

Copending application Ser. No. 08/574,357, now U.S. Pat. No. 5,721,689 assigned to the same assignee hereunder, discloses and claims a technique for accurate frequency tracking and phasor estimation in a GPU. According to that technique, a signal is sampled at a fixed Δt over a cycle window that includes N samples. The intantaneous frequency of the signal, f+Δf, is estimated for each sample as explained above in connection with equations 12, 13, and 14. The instantaneous frequencies estimated over the cycle window N are then averaged to generate an average cycle frequency. The average cycle frequency is then used to select the cycle or DFT window N for the next cycle. Specifically, the average cycle frequency is compared to a predefined table of discrete frequencies to identify the discrete frequency with the closest frequency value to the average cycle frequency. The DFT window for the next cycle is selected based on the closest discrete frequency. Thus the cycle N is varied instead of the sampling interval, Δt. However, a minimal error is generally introduced by selecting N based on a corresponding discrete frequency that may differ from the actual frequency.

In the exemplary case of a GPU, accurate voltage and current estimates are needed to ensure that the GPU detects the presence of a fault condition and acts promptly to protect the circuit. Voltage and current magnitudes are estimated based on voltage and current phasors, respectively, generated by a frequency tracking algorithm such as the one described in U.S. Pat. No. 5,721,689.

As described above, when an estimated frequency falls between two discrete frequencies in the predefined table, the nearest frequency to the estimate is applied to the DFT. The discrepancy in the frequencies introduces an error which is manifested as oscillations in the DFT estimate. Consequently, the phasor estimates, which are based on the DFT estimates, and the signal magnitude estimates, which are based on the phasor estimates, are also subject to these errors.

Thus, there is a need for a method of compensating for errors in phasor estimation due to oscillations caused by discrete fourier transforms used to estimate signal frequency.

SUMMARY OF THE INVENTION

The present invention fulfills these needs by providing a method of tracking the frequency of a signal including the following steps: sampling the signal at a predetermined fixed sampling rate to generate a sequence of N successive samples; determining for each successive sample the phase angle of the signal based on the N successive samples; determining the change in phase angle of the signal based upon the difference between the phase angle corresponding to a current sample and the phase angle corresponding to a most previous sample; estimating the instantaneous frequency of the signal based upon the change in phase angle; generating a non-oscillating phasor, indicative of the instantaneous magnitude, angular frequency, and phase angle of the signal, based on the instantaneous frequency estimate; averaging the instantaneous frequencies of the N successive samples to determine an average cycle frequency; and adjusting N based on the average cycle frequency.

In a preferred embodiment, an N-point DFT is performed for each successive sample thereby generating a phasor indicative of the instantaneous magnitude, angular frequency, and phase angle of the signal. The change in phase angle is then the argument of the phasor corresponding to the current sample to the phasor corresponding to the most previous sample.

According to the invention, a range of discrete frequencies $f_n$ is preferably defined such that each discrete frequency in the range is the predetermined fixed sampling rate divided by a multiple integer of samples $N_n$, wherein the multiple integer of samples is the number of samples per cycle of the corresponding discrete frequency based on the predetermined fixed sampling rate. The instantaneous frequencies are also preferably averaged over each cycle resulting in an average cycle frequency. The instantaneous frequency corresponding to a current sample f(k) can then be estimated according to the following relationship:

$$f(k)=\theta(k)\cdot(f_n\cdot N_n/2\pi)$$

where $\theta(k)$ is the change in phasor angle, $f_n$ is the discrete frequency closest to the previous average cycle frequency and $N_n$ is the number of samples per cycle corresponding to the discrete frequency. More preferably, a maximum number of successive samples $N_{max}$ is defined. For each $N_n$ that does not exceed Nmax all of the $N_n$ samples are utilized in determining the phase angle of the signal. For each $N_n$ greater than $N_{max}$, a predetermined number of samples $N_{skip}$ are skipped so that the N samples used in determining the phase angle of the signal exclude $N_{skip}$ samples between each of the N samples and $N_n$ is reduced by the factor of ($N_{skip}$+1). The instantaneous frequency can then be estimated according to the following relationship:

$$f(k)=\theta(k)\cdot(f_n\cdot N_n\cdot(N_{skip}+1)/2\pi).$$

The method of the present invention compensates for errors introduced into the phasor estimation process due to oscillations caused by the DFT computations. These oscillations result from using a fundamental frequency that is offset from the actual signal frequency. The present invention compensates for the oscillations by computing a non-oscillating phasor, from which accurate voltage or current magnitudes can be determined. The non-oscillating phasor, which is indicative of the instantaneous magnitude, angular frequency, and phase angle of the signal, is based on the instantaneous frequency estimate. In a preferred embodiment of the present invention, matrix algebra is employed to compute the non-oscillating phasor. The inventive method may be particularly advantageous when implemented in a generator protection unit (GPU).

A generator protection system for analyzing voltage and current signals output from a generator using the inventive methods is also provided. The generator protection system according to the invention includes a sampling means for receiving an input of the signals and sampling them at a predetermined fixed rate to provide an output of sampled signals, and a signal processor coupled to the sampling means to receive an input of the sampled data and for estimating the operating frequency of the generator by carrying out at least one N-point DFT where N corresponds to the DFT window to provide an instantaneous frequency estimate. According to the invention, the signal processor varies N based on the estimated average cycle frequency.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION OF THE INVENTION

Figure 4:
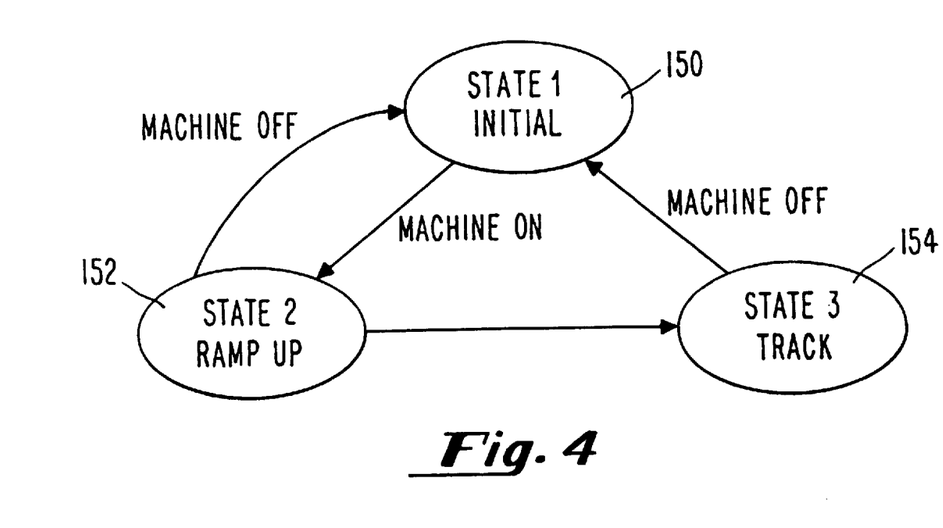
FIG. 4 shows a state diagram of the overall frequency tracking procedure implemented in a GPU in accordance with the present invention.

FIG. 4 shows a state diagram of the overall frequency tracking procedure implemented in a GPU in accordance with the present invention. During the initial state at 150, the signal samples are monitored to check for a "non-zero" condition indicating that the generator has been energized, i.e. the generator has been turned on and current has been supplied (referred to hereinafter as a "machine on condition"). Once a machine on condition has been detected, the procedure advances to the next state, generator ramp up at 152. During the generator ramp up state, frequency tracking is commenced until the generator is ramped up to its fundamental frequency, i.e., the anticipated operating frequency when fully energized. In other words, if the operating frequency of the generator should be 60 Hz when fully energized, the fundamental frequency is defined herein as 60 Hz. During the ramp up state the generator frequency is tracked and a DFT window is determined even if the frequency has not reached the fundamental frequency.

Once the ramp up frequency has been tracked for a full cycle, the procedure advances to the next state, tracking at 154. During tracking, phasors are generated and the frequency estimated thereby tracking any variations in the operating frequency. Since any such variations should be relatively small, transient control is preferably implemented. During both the generator ramp up state 152 and the tracking state 154, the sampled signals may be monitored to detect a "machine off condition" in which the generator has been shut down or has failed. Once a machine off condition is detected the procedure returns to the initial state 150.

The frequency tracking techniques used during both the ramp up and tracking states are described in detail in U.S. Pat. No. 5,721,689. It should be understood, however, that the techniques described hereinbelow for the tracking state may be applied to frequency tracking and phasor estimation in the ramp up state as well.

Figure 5:
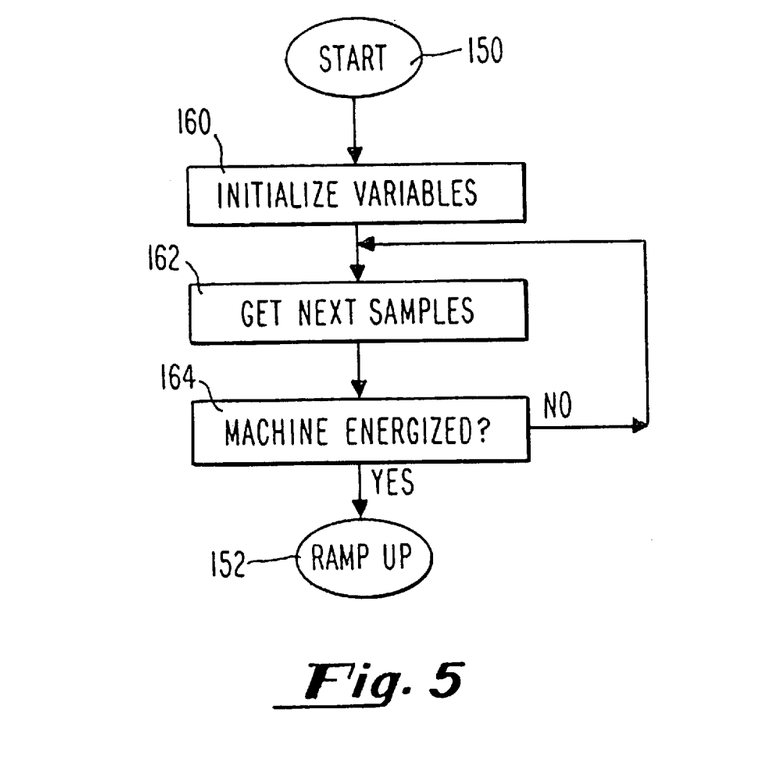
FIG. 5 shows a flow chart of the steps carried out by the tracking procedure during the initial state in accordance with a preferred embodiment of the invention.

FIG. 5 shows a flow chart of the steps carried out by the tracking procedure during the initial state in accordance with a preferred embodiment of the invention. As shown in FIG. 5, a number of program variables are initialized at step 160 as follows: the sample counter (k) is initialized to 0; the initial number of samples per cycle ($N_i$) which will be equivalent to the first DFT window N is set to 32; the block transient counter, B(C), which is described below is set to 0; the accumulated frequency ($f_{total}$) also described below is set to 0; an initial cycle flag ($C_i$) used in the ramp up procedure is set to 1; an initial update flag (UPDATE) used in the ramp up procedure is set to 1; a cycle counter C is set to 0; P(0) an initial phasor is set equal to the complex value 1+j0; the average cycle frequency ($f_{new}(C)$) which is described in detail below is set to 60 Hz. Corresponding values of $N_n$ and $N_{skip}$ from Table 1 which is explained below, are 32 and 0, respectively. The samples output from the A/D converter are monitored at step 162 until a "non-zero" set of samples is detected at 164 indicating a "machine on condition." Once a machine on condition is encountered the tracking procedure advances to the generator ramp up state 152.

Figure 6A:
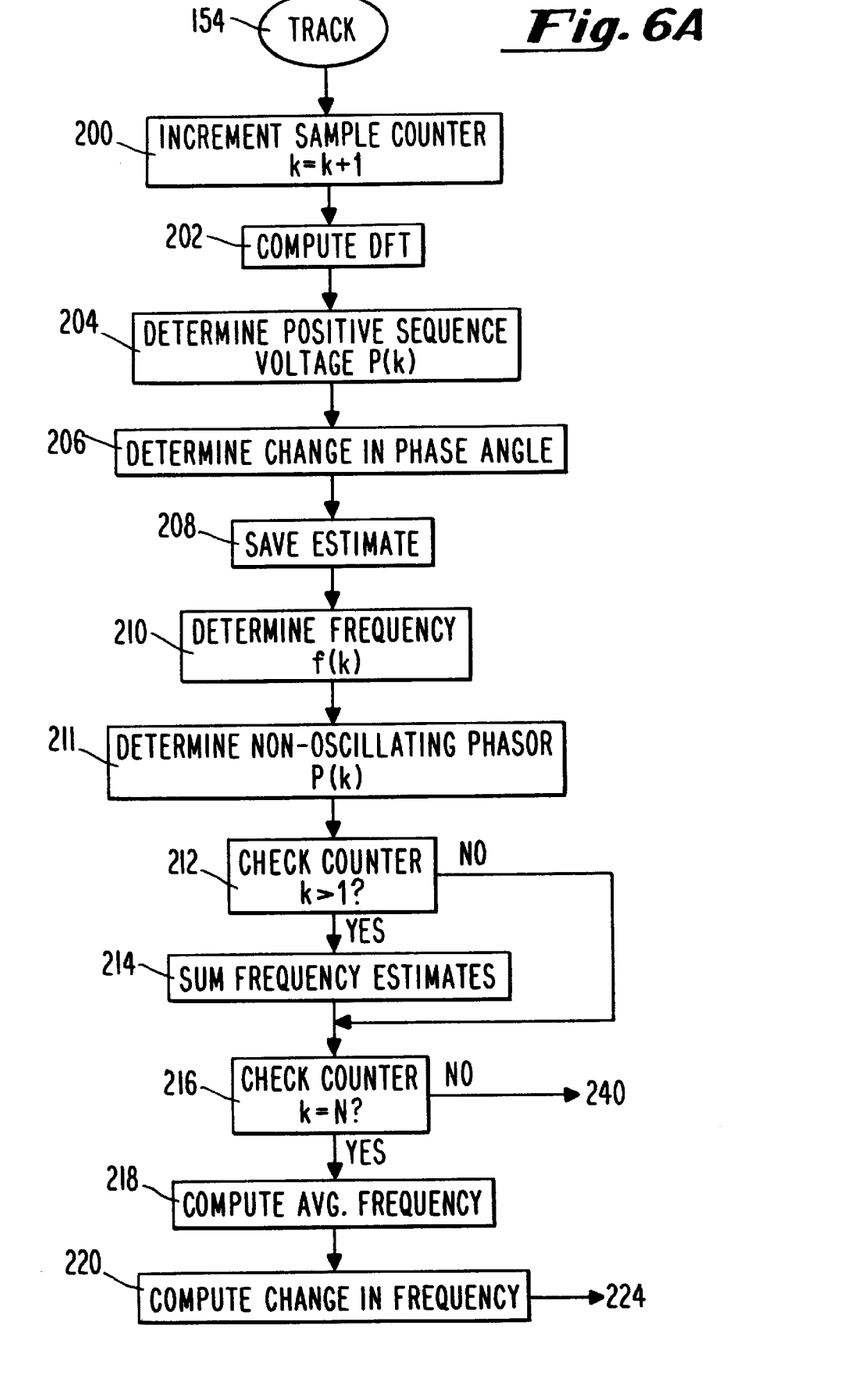
FIGS. 6A and 6B show a flow chart of the steps carried out during the frequency tracking state in a preferred embodiment of the present invention.
Figure 6B:
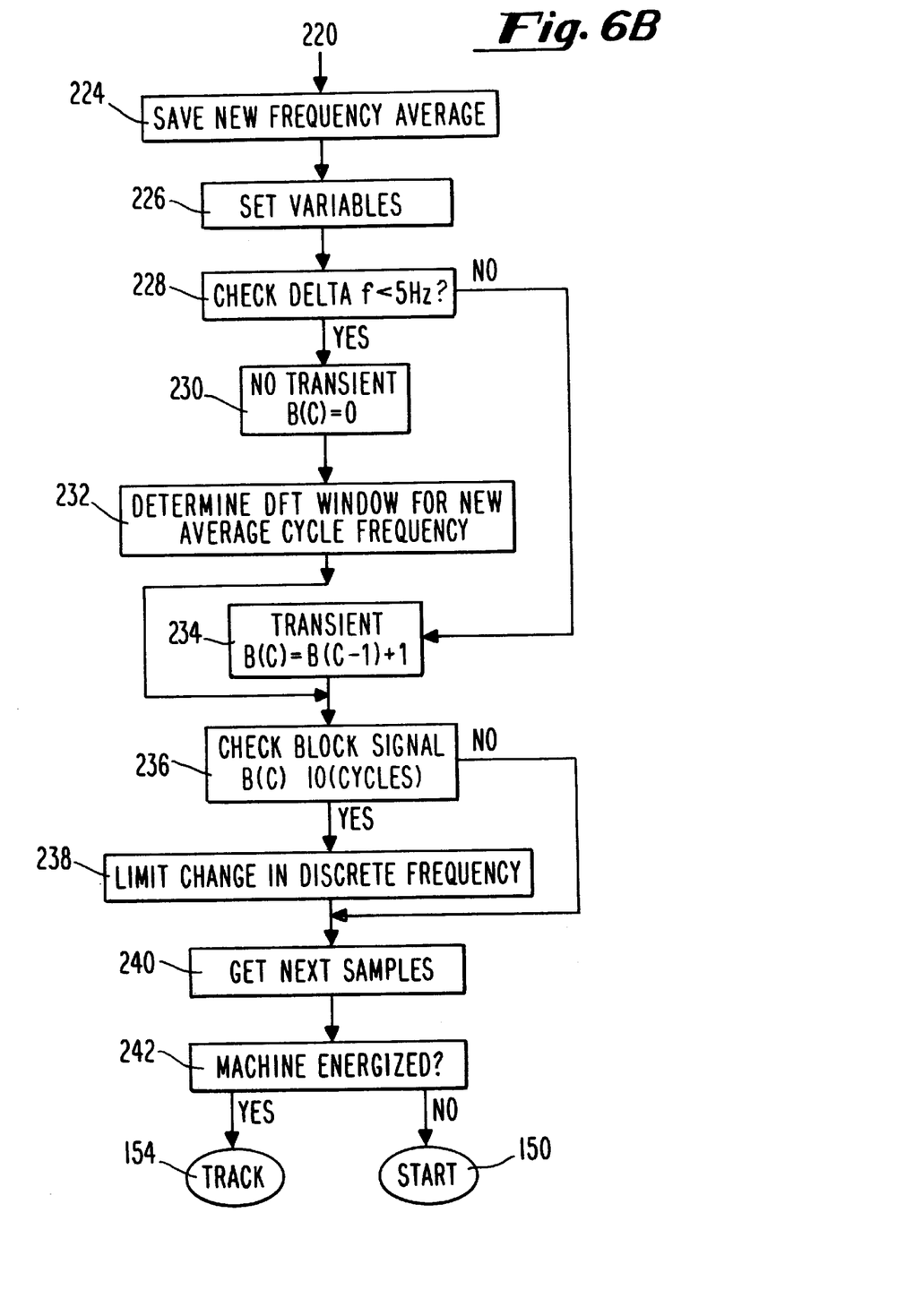

FIGS. 6A and 6B show a flow chart of the steps carried out during the frequency tracking state in a preferred embodiment of the present invention. The sample counter, k, is incremented at step 200 after each sampling interval in which a set of signals is received (e.g., one sample from each of the following sensed signals $v_A$, $v_B$, $v_C$, $i_A$, $i_B$, and $i_C$). If the received set of samples does not contain line-to-line voltage samples, then line-to-line samples are computed as follows:

$$v_{AB}(k)=v_A(k)-v_B(k) \tag{16}$$

$$v_{BC}(k)=v_B(k)-v_C(k) \tag{17}$$

$$v_{CA}(k)=v_C(k)-v_A(k) \tag{18}$$

A DFT is performed at step 202 to estimate the line-to-line voltage phasors. The method of the present invention tracks the frequency and uses the frequency estimates to vary the number of samples, N, in the DFT window. The DFT window according to the present invention is adjusted to be as close to 1 cycle of the signal as possible. However, since the sampling interval is fixed, the possible fundamental frequencies are discrete. Specifically, the fundamental frequency must have a period that is an integer value of the sampling interval. For a sampling interval of $\Delta t$, the possible frequencies are $1/(N\Delta t)$ where N is the number of samples per cycle.

In some applications it may be preferable to limit the number of samples actually used in the DFT. While the variable window is able to cover a large frequency range, the window length can become very large for real time computations. This problem is overcome by not utilizing every sample in the DFT window for the DFT computation, but rather only enough samples to satisfy the Nyquist criterion. In particular, a number of samples to be skipped ($N_{skip}$) for certain discrete frequencies may be selected so that the DFT does not use more than a maximum number of samples ($N_{max}$). Accordingly, for a sampling interval of $\Delta t$, the possible frequencies are:

$$1/(N_n(N_{skip}+1)\cdot \Delta t)$$

where $N_n$ is the number samples in the DFT computation and the product $N_n(N_{skip}+1)$ is the total number of samples per cycle at the corresponding discrete frequency $f_n$. Thus, the product $N_n(N_{skip}+1)$ defines the DFT window.

For the case of $\Delta t=(1/60)/32$ (32 samples per cycle at 60 Hz), some of the possible discrete frequencies are listed in Table 1 below. According to a preferred embodiment of the present invention, a maximum number of samples Nmax of 38 is imposed for the DFT computation by skipping $N_{skip}$ samples between every sample used in the DFT as set forth in Table 1 below.

TABLE 1

| Frequency (f$_n$) | No. of DFT Samples (N$_n$) | No. of Samples to Skip (N$_{skip}$) |
| --- | --- | --- |
| 87.2727 | 22 | 0 |
| 83.4783 | 23 | 0 |
| 80.0000 | 24 | 0 |
| 76.8000 | 25 | 0 |
| 73.8462 | 26 | 0 |
| 71.1111 | 27 | 0 |
| 68.5714 | 28 | 0 |
| 66.2069 | 29 | 0 |
| 64.0000 | 30 | 0 |
| 61.9355 | 31 | 0 |
| 60.0000 | 32 | 0 |
| 58.1818 | 33 | 0 |
| 56.4706 | 34 | 0 |
| 54.8571 | 35 | 0 |
| 53.3333 | 36 | 0 |
| 51.8919 | 37 | 0 |
| 50.5263 | 38 | 0 |
| 48.0000 | 20 | 1 |
| 45.7143 | 21 | 1 |
| 43.6364 | 22 | 1 |
| 41.7391 | 23 | 1 |
| 40.0000 | 24 | 1 |
| 38.4000 | 25 | 1 |
| 36.9231 | 26 | 1 |
| 35.5556 | 27 | 1 |
| 34.2857 | 28 | 1 |
| 33.1034 | 29 | 1 |
| 32.0000 | 30 | 1 |
| 30.9677 | 31 | 1 |
| 30.0000 | 32 | 1 |
| 29.0909 | 33 | 1 |
| 28.2353 | 34 | 1 |
| 27.4286 | 35 | 1 |
| 26.6667 | 36 | 1 |
| 25.9459 | 37 | 1 |
| 25.2632 | 38 | 1 |
| 24.6154 | 26 | 2 |
| 23.7037 | 27 | 2 |
| 22.8571 | 28 | 2 |
| 22.0690 | 29 | 2 |
| 21.3333 | 30 | 2 |
| 20.6452 | 31 | 2 |
| 20.0000 | 32 | 2 |
| 19.3939 | 33 | 2 |
| 18.8235 | 34 | 2 |
| 18.2857 | 35 | 2 |
| 17.7778 | 36 | 2 |
| 17.2973 | 37 | 2 |
| 16.842 | 38 | 2 |

At step 202, an N-point DFT is performed for each of the line-to-line voltages, resulting in 3 phasors representative of each instantaneous line-to-line voltage corresponding to the current interval k. The DFT is computed at step 202 from equation (6) above. For the frequency range of interest (about 16–88 Hz) in a preferred embodiment of the invention, a one-cycle DFT window would include 22 to 96 samples.

Note that the largest frequency 'step' is at higher frequencies and is about 4 Hz. However, since the actual frequency window is preferably adjusted to the nearest possible integer window, the frequency should be within one half of this value, about 2 Hz. It should be understood that performing a DFT using a fundamental frequency other than the actual frequency of the signal will cause oscillations in the DFT estimate and, consequently, in the phasor estimate. As will be explained in more detail below, these oscillations do not significantly affect the frequency estimate, but do adversely affect the magnitude estimate. The method of the present invention provides a mechanism to compensate for errors in the phasor estimate caused by oscillations in the DFT.

Figure 7:
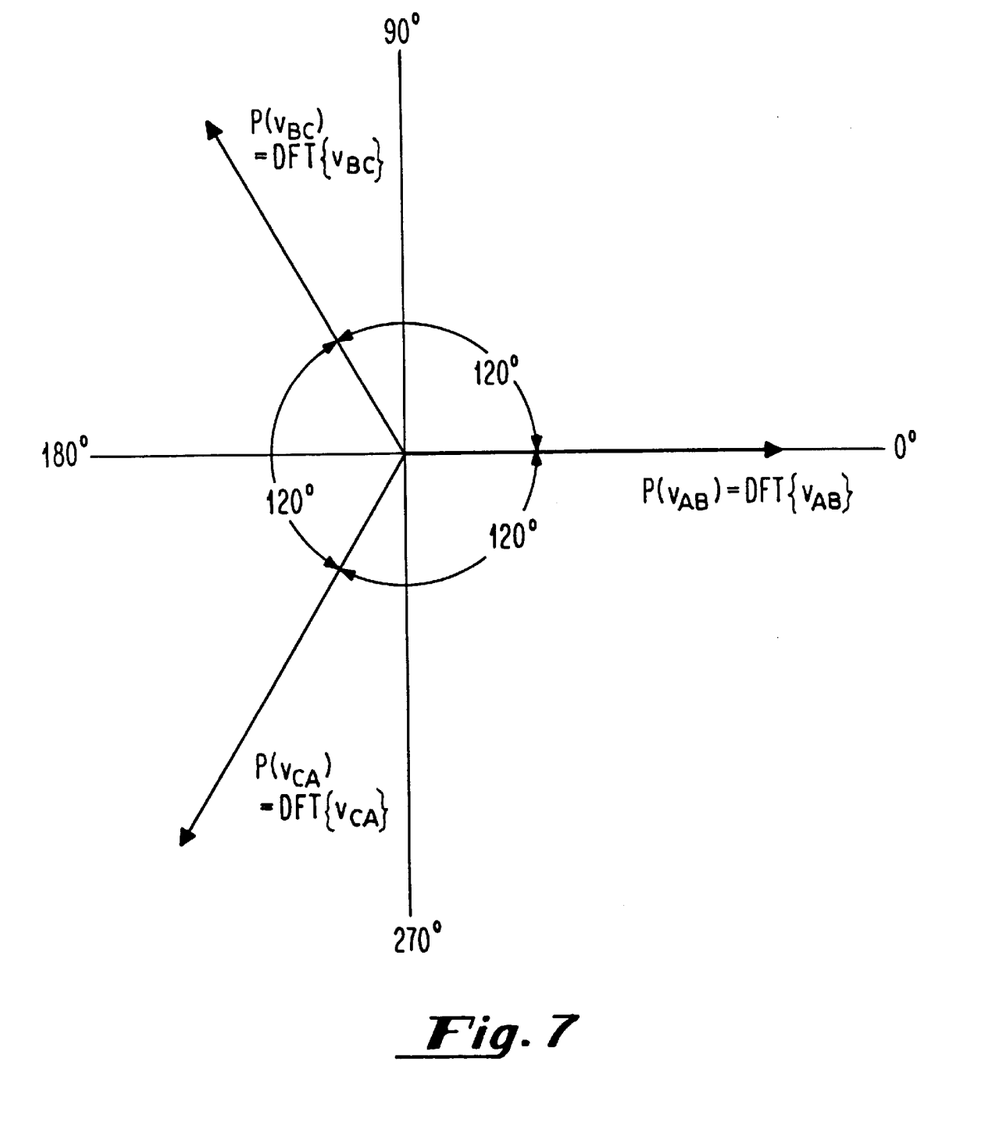
FIG. 7 shows a phasor diagram for a balanced system.

Next, the positive sequence voltage is computed at step 204 from the DFT outputs for the current sample, k. Power systems are known to have positive sequence components, negative sequence components and zero sequence components. FIG. 7 shows a phasor diagram for a balanced system. If all 3 phases of the power system are balanced then only positive sequence components are present. In a balanced system, the three line-to-line voltage phasors are equispaced in the phasor diagram such that the three phasors are separated by 120° as shown in FIG. 7. A positive sequence voltage phasor can be generated by shifting two of the phasors to overlie the remaining phasor. For example, if $P(v_{BC})$ is shifted −120° and $P(v_{CA})$ is shifted −240°, then all three phasors have the same phasor angle $P(v_{AB})$ of 0°. Thus a single phasor representing the positive sequence components is generated at step 204 for a balanced three-phase system according to the following equation:

$$P'(k)=\tfrac{1}{3}(\text{DFT}\{v_{AB}(k)\}+a\cdot\text{DFT}\{v_{BC}(k)\}+a^2\cdot\text{DFT}\{v_{CA}(k)\}) \quad (19)$$

where P'(k) is the positive sequence phasor associated with the current sampling interval, k, and a is a constant phasor corresponding to the desired phase shift. For example, a is the complex value (−0.5+jSQRT(3)/2).

The change in phasor angle between P'(k) and P'(k−1) is then determined at step 206. From equation (13) above, it can be seen that the change in phasor angle, θ(k), is:

$$ARG\{P'(k)/P'(k-1)\} \quad (20)$$

which is simply the phase angle of the phasor generated during the current sampling interval, k, minus the phase angle of the phasor generated during the most previous or last sampling interval, k−1. The positive sequence phasor for the current sampling interval is then stored at step 208 for use in determining the change in phasor angle during the next sampling interval.

An instantaneous frequency is then determined at step 210 based on equation (14). Solving for f+Δf yields:

$$f(k)=f+\Delta f=\theta(k)\cdot f\cdot N/2\pi \quad (21)$$

where f(k) represents the instantaneous operating frequency during the kth sampling interval, f is the most recently computed average cycle frequency and N is the number of sample intervals in the DFT window. Since the number of samples per cycle N can vary from each sampling interval to the next, it is difficult to ascertain an integer number of samples per cycle corresponding to the average cycle frequency. Accordingly, f and N are preferably obtained from a table of discrete frequencies $f_n$ with corresponding DFT windows $N_n \cdot (N_{skip}+1)$ such as Table 1 above. Rewriting equation (21) results in:

$$f(k)=\theta(k)\cdot f_n \cdot N_n \cdot (N_{skip}+1)/2\pi. \quad (22)$$

Utilizing the positive sequence phasor in the tracking procedure renders the tracking more reliable in the event that one or even two of the line-to-line voltages are not detected during a particular cycle. So long as one of the line-to-line voltage phasors can be generated, the phase angle can be determined and, in turn, an instantaneous frequency can be estimated. Moreover, since two consecutive positive sequence voltages are used to determine the change in phase angle, and since the change in phase angle is generally small, the oscillations described above do not significantly affect the frequency estimate. However, if the actual signal frequency differs from the fundamental frequency used in the DFT (i.e., the discrete frequency selected from Table 1), the oscillations can cause undesirable errors in determining the magnitude of the phasor.

The method of the present invention provides a technique to compensate for errors in phasor estimation due to oscillations in the DFT estimate. In a preferred embodiment of the present invention, the estimated frequency values, f and Δf, are used to compute non-oscillating current and voltage phasors at step 211 to determine the magnitudes of the voltage and current at the GPU.

To correct for the error due to oscillations in the DFT estimate, the phasor is recomputed using the actual signal frequency as determined at step 210. Refer once again to equations (8) and (9), where P is the complex phasor and P* is the complex conjugate of P. It should be understood that the two phasors, $k_1 \cdot P$ and $k_2 \cdot P^* \cdot e^{j2\pi/N}$, rotate in opposite directions in the complex plane and that these opposing rotations cause the oscillations in the DFT estimates. Note that P depends on both f and Δf.

Thus, once both f and Δf are known at step 210, P can be computed. Using the actual signal frequency to compute the phasor rather than the DFT fundamental frequency removes from the phasor estimate any errors due to oscillations. Thus, P is a non-oscillating, complex phasor indicative of the magnitude, frequency, and phase of the signal.

In a preferred embodiment of the present invention, equations (8) and (9) are solved for P as follows. By breaking the DFT output into real and imaginary components, equation (8) may be rewritten as:

$$E_{real} + jE_{imag} = k_1 \cdot (P(k)_{real} + jP(k)_{imag}) + k_2 (P(k)_{real} - jP(k)_{imag}) \cdot (\cos(2\pi/N) j\sin(2\pi/N)) \quad (23)$$

where, P(k) is the phasor associated with the current sampling interval k.
Thus, $$E_{real} = k_1 P(k)_{real} + k_2 P(k)_{real} \cos(2\pi/N) - k_2 P(k)_{imag} \sin(2\pi/N) \text{ and}$$
$$E_{imag} = k_1 P(k)_{imag} - k_2 P(k)_{real} \sin(2\pi/N) - k_2 P(k)_{imag} \cos(2\pi/N) \quad (24)$$

Equations (24) are written in matrix form as:

$$\begin{bmatrix} E_{real} \\ E_{imag} \end{bmatrix} = \begin{bmatrix} k_1 + k_2 \cos\left(\frac{2\pi}{N}\right) & -k_2 \sin\left(\frac{2\pi}{N}\right) \\ -k_2 \sin\left(\frac{2\pi}{N}\right) & k_1 - k_2 \cos\left(\frac{2\pi}{N}\right) \end{bmatrix} \begin{bmatrix} P_{real} \\ P_{imag} \end{bmatrix}$$

or as $E = A(k) \cdot P(k)$, where $$A(k) = \begin{bmatrix} k_1 + k_2 \cos\left(\frac{2\pi}{N}\right) & -k_2 \sin\left(\frac{2\pi}{N}\right) \\ -k_2 \sin\left(\frac{2\pi}{N}\right) & k_1 - k_2 \cos\left(\frac{2\pi}{N}\right) \end{bmatrix}$$

and therefore, $$P(k) = A(k)^{-1} \cdot E \quad (25)$$

Thus, once f and Δf are determined as described above, the matrix A(k) is determined. Once A(k) is determined, P(k) is determined at step 211 by performing a matrix inversion and a matrix multiplication. It should be understood that other approaches may be used to solve for the non-oscillating phasor P(k), such as a least-squares estimation using multiple DFT outputs.

Steps 212, 214, 216 and 218 perform the frequency averaging over each cycle. The instantaneous frequencies are accumulated ($f_{total}$) at step 214. Because the DFT window used in DFT computation during the last sampling interval of the previous cycle may be different from the DFT window used in the DFT computation in the current cycle, the change in phasor angle determined at step 206 may be inaccurate for the first sampling interval of each cycle. Therefore in a preferred embodiment, step 212 serves to bypass the frequency accumulator for the first frequency estimate, f(k=1). When the end of the cycle is reached as determined at step 216, the average cycle frequency $f_{new}(C)$ is generated by dividing the accumulated frequency by the number of accumulated instantaneous frequencies, which is preferably k−1.

The change in frequency, Δf, between the current cycle and the previous cycle is determined at step 220 by subtracting the average cycle frequency determined during the last cycle $f_{new}(C-1)$ from the average cycle frequency determined for the current cycle $f_{new}(C)$. Accordingly, the average cycle frequency determined during the current cycle, $f_{new}(C)$, is saved at step 224 for use during the next cycle determination of Δf.

The counter k and frequency accumulator $f_{total}$ are reset at step 226 and the cycle counter C is also incremented at step 226. For normal operation of the GPU, the frequency will not change significantly from cycle-to-cycle, and consequently Δf is expected to be small, i.e. less than about 5 Hz. So long as Δf is less than a predetermined threshold, e.g. 5 Hz, as determined at step 228, a block transient counter B(C) is reset to zero at step 230 and the next set of samples from the A/D converter are accepted at step 240.

The new DFT window is determined by identifying the discrete frequency in the lookup table that is closest in value to the average cycle frequency and defining the new DFT window equal to the number of samples per cycle, $N_n(N_{skip}+1)$, corresponding to that frequency. For example, if $f_{new}(C)$ is 67 Hz, then from Table 1, the closest discrete frequency $f_n$=66.209 Hz. The corresponding number of samples per cycle $N_n$ is 29 with no samples being skipped, $N_{skip}$0. Thus during the next cycle, the DFT window is N=29 samples per cycle. As a further example, if $f_{new}(C)$ is 39.5 Hz, the closest discrete frequency from Table 1 is 40 Hz. The total number of samples per cycle is 48 samples (1920 Hz/40 Hz). Since in the preferred embodiment, the DFT window is limited to a maximum of 38 samples, every other one of the 48 samples is skipped, $N_{skip}$=1, and the number of samples in the DFT window is 24×20=480 from Table 1 with only 24 samples used in the DFT computation.

If the generator is still energized as determined at step 242 by checking that the set of samples accepted are non-zero, then the procedure remains in the tracking state 154. If however, a "machine off condition" is detected, then the procedure returns to the initial state 150.

If a transient occurs, Δf may be greater than 5 Hz at step 228. In such a case, the DFT window is not updated at step 232. Instead the block transient counter is incremented at 234. It should be understood that the sign of the frequency difference may also be evaluated such that the increments correspond to Δf being less than −5 Hz or correspond to Δf being greater than 5 Hz. If during the next cycle Δf returns a value lower than the predefined threshold, then the block transient counter is reset at step 230. If the block transient counter is incremented a predetermined number of successive cycles, blocking the update of the DFT window will be disabled at step 238 by adjusting the frequency by the predetermined threshold. In the preferred embodiment, 5 Hz is used as the predetermined threshold and 10 cycles is used as the predetermined number of cycles that a DFT window update may be blocked. If the block counter does exceed the predetermined number of successive cycles, the discrete frequency $f_n$ that corresponds to the current DFT window N is adjusted by 5 Hz, +5 Hz if Δf is positive and −5 Hz if Δf is negative, at step 238. It is contemplated that in most situations frequency tracking can be restored through such adjustments.

It should be understood that the above described method may be used to estimate phasors for both voltage and current signals.

Figure 8:
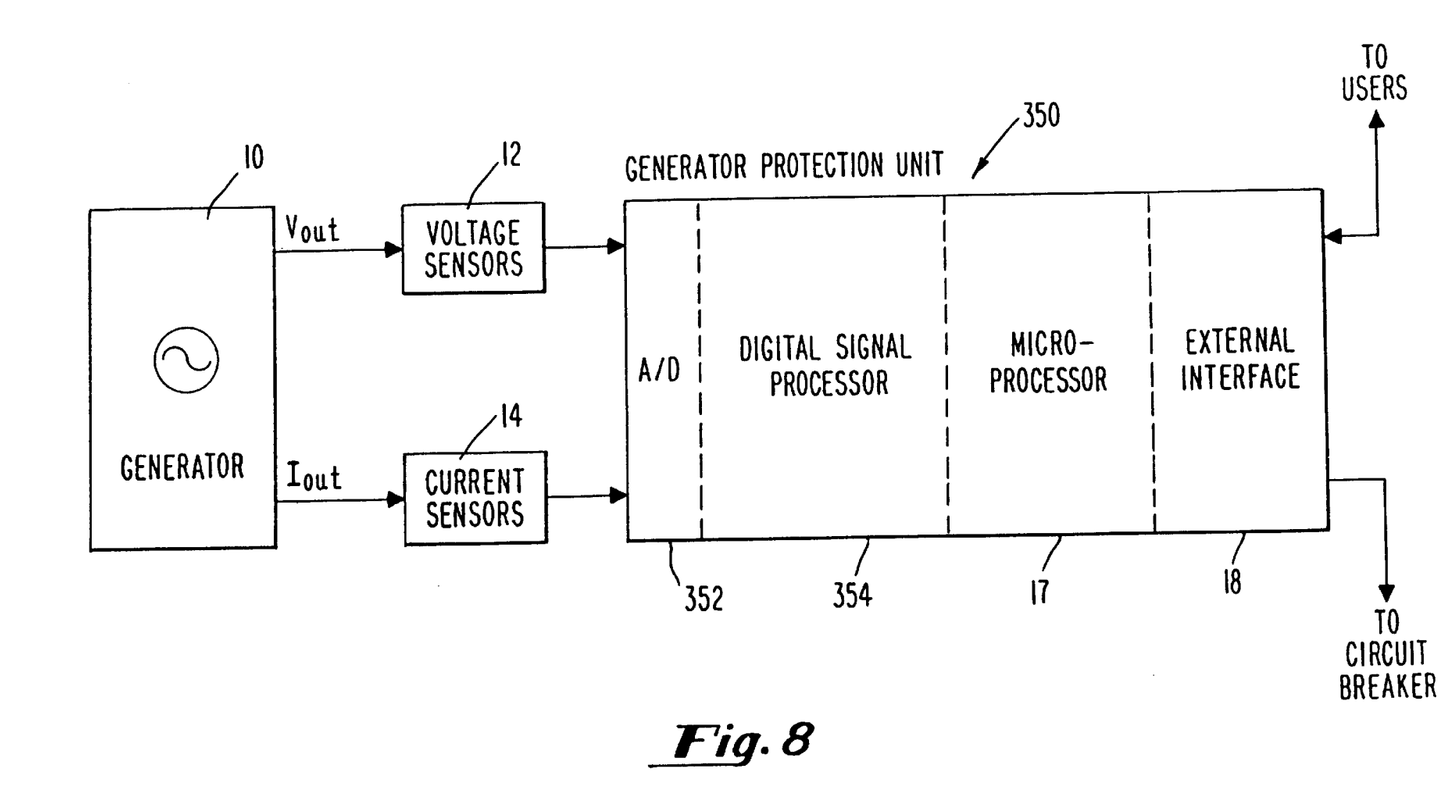
FIG. 8 shows a block diagram of a generator protection system according to the present invention.

FIG. 8 shows a block diagram of a generator protection system in accordance with the present invention. The GPU 350 is programmed in accordance with the phasor estimation and frequency tracking procedures as described hereinabove. The generator 10, current sensor 14, voltage sensor 12, microprocessor 17 and external interface 18 function in a substantially identical manner as described in connection with FIG. 1. The A/D converter 352 is programmed to sample at a fixed sampling interval unlike the A/D converter 15 shown in FIG. 1 which samples at a variable rate. The DSP 354 is specifically programmed in accordance with the present invention to track the operating frequency of the generator and determine magnitudes of voltage and current by generating non-oscillating phasors based on instantaneous frequency estimates.

While the invention has been described and illustrated with reference to specific embodiments, those skilled in the art will recognize that modification and variations may be made without departing from the principles of the invention as described hereinabove and set forth in the following claims.

We claim:

1. A method of tracking the frequency of a signal having an estimated frequency, comprising the steps of:
   sampling the signal at a predetermined fixed sampling rate to generate a sequence of N successive samples;
   determining for each successive sample a phase angle of the signal based on the N successive samples;
   determining the change in phase angle of the signal based upon the difference between the phase angle corresponding to a current sample and the phase angle corresponding to a most previous sample;
   estimating the instantaneous frequency of the signal based upon the change in phase angle;
   generating, based on the instantaneous frequency estimate, a non-oscillating phasor indicative of the instantaneous magnitude, angular frequency, and phase angle of the signal;
   averaging the instantaneous frequencies of the N successive samples to determine an average cycle frequency; and
   adjusting N based on the average cycle frequency.

2. The method of claim 1, wherein the step of determining the phase angle of the signal comprises the step of:
   performing an N-point DFT for each successive sample thereby generating a phasor indicative of the instantaneous magnitude, angular frequency, and phase angle of the signal.

3. The method of claim 2, wherein the change in phase angle is the argument of the phasor corresponding to the current sample to the phasor corresponding to the most previous sample.

4. The method of claim 1, further comprising the step of:
   defining a range of discrete frequencies $f_n$ such that each discrete frequency in the range is the predetermined fixed sampling rate divided by a multiple integer of samples $N_n$, wherein the multiple integer of samples is the number of samples per cycle of the corresponding discrete frequency based on the predetermined fixed sampling rate.

5. The method of claim 4, wherein the instantaneous frequency corresponding to the current sample, f(k), is estimated according to the following relationship:

$$f(k) = \theta*(f_n*N_n*/N_{skip}+1)/2\pi).$$

where $\theta$ is the change in phasor angle, $f_n$ is the discrete frequency closest to the average cycle frequency, and $N_n$ is the number of samples per cycle corresponding to the discrete frequency.

6. The method of claim 5, wherein a maximum number of successive samples $N_{max}$ is defined, for each $N_n$ that does not exceed $N_{max}$ all of the $N_n$ samples are utilized in determining the phase angle of the signal, for each $N_n$ greater than $N_{max}$, a predetermined number of samples $N_{skip}$ are skipped so that the N samples used in determining the phase angle of the signal exclude $N_{skip}$ samples between each of the N samples and $N_n$ is reduced by the factor of $(N_{skip}+1)$, and wherein the instantaneous frequency is estimated according to the following relationship:

$$f(k) = \theta*(f_n*N_n*(N_{skip}+1)/2\pi).$$

7. The method of claim 2, wherein the step of adjusting N comprises the steps of:
   generating a predetermined pairing of discrete frequencies $f_n$ and corresponding number of samples $N_n$ such that $f_n*N_n$ is equal to the fixed predetermined sampling rate;
   identifying the discrete frequency closest to the average cycle frequency;
   selecting the number of samples $N_n$ corresponding to the discrete frequency so identified; and
   defining the number of samples N to be the number of samples $N_n$.

8. A method of tracking the operating frequency of an electrical generator in a generator protection unit (GPU), wherein the generator outputs a plurality of voltage signals to the GPU, the method comprising the steps:
   sampling the voltage signals at a predetermined fixed rate to produce a set of voltage samples at N successive sampling intervals where N is the number of samples per cycle of the voltage signals;
   generating a phasor representative of the positive sequence voltage of the plurality of voltage signals during each successive sampling interval;
   determining a change of the angle of the phasor generated during a current sampling interval and the angle of a phasor generated during a most previous sampling interval;
   estimating the instantaneous frequency of the generator based on the change of the angle;
   generating, based on the instantaneous frequency estimate, a non-oscillating phasor indicative of the instantaneous magnitude, angular frequency, and phase angle of the voltage signal;
   averaging the instantaneous frequencies of the N successive samples to determine an average cycle frequency; and
   adjusting N based on the average cycle frequency.

9. The method of claim 8, wherein the step of generating the phasor is carried out using at least one N-point DFT, the method further comprising the steps of:
   generating a predetermined pairing of discrete frequencies $f_n$ and corresponding number of samples $N_n$ such that $f_n*N_n$ is equal to the fixed predetermined sampling rate;

identifying the discrete frequency closest to the average cycle frequency; and selecting the number of samples $N_n$ corresponding to the discrete frequency so identified and defining the number of samples N to be the number of samples $N_n$ for the next cycle.

10. The method of claim 8, further comprising the steps of:

determining the difference between the average cycle frequency associated with a current cycle and the average cycle frequency associated with a most previous cycle and defining the difference as a frequency shift;

incrementing a transient block counter if the frequency shift is greater than a predetermined threshold; and adjusting the average cycle frequency by a predetermined frequency adjustment when the transient block counter exceeds a predetermined value.

11. The method of claim 10, wherein the predetermined threshold and the predetermined frequency adjustment are each about 5 Hz.

12. The method of claim 10, wherein the transient block counter is reset to zero each time the frequency shift does not exceed the predetermined threshold and wherein the predetermined value is ten.

13. The method of claim 8, wherein the operating frequency of the generator is tracked when the operating frequency is between about 16 Hz and 87 Hz.

14. The method of claim 13, wherein the maximum number of successive samples does not exceed 38 samples.

15. A generator protection system for analyzing voltage and current signals output from a generator wherein the voltage and current signals are monitored by respective voltage and current sensors to produce a plurality of signals representative of voltage and current characteristics of the generator, the generator protection system comprising:

1) sampling means for receiving an input of the plurality of signals and sampling the plurality of signals at a predetermined fixed rate to provide an output of sampled signals; and 2) a processing means coupled to the sampling means and receiving an input of the sampled data, the processing means a) estimating the operating frequency of the generator by carrying out at least one N-point DFT where N corresponds to the DFT window to provide an instantaneous frequency estimate, b) generating, based on the instantaneous frequency estimate, a non-oscillating phasor indicative of the instantaneous magnitude, angular frequency, and phase angle of the signal, c) averaging each of the instantaneous frequency estimates over an interval corresponding to one cycle of the operating frequency and defining the same as an average cycle frequency, d) updating the duration of the interval so that the duration of a current interval is based on the average cycle frequency estimated during a most previous interval, and e) varying N based on the average cycle frequency estimate.

* * * * *

UNITED STATES PATENT AND TRADEMARK OFFICE
CERTIFICATE OF CORRECTION

PATENT NO. : 5,832,414

DATED : November 3, 1998

INVENTOR(S) : David G. Hart et al.

It is certified that error appears in the above-indentified patent and that said Letters Patent is hereby corrected as shown below:

Col. 2, line 65, "At" should be --$\Delta t$--

Col 3, equation #9 should read:

$$k1 = \frac{\sin(\frac{n\Delta f}{f})}{N\sin(\frac{n\Delta f}{fN})}, \quad k2 = \frac{\sin(\frac{n\Delta f}{f})}{N\sin(\frac{n\Delta f}{fN} + \frac{2\pi}{N})}, \quad P = Be^{j\gamma}e^{j(\frac{n\Delta f}{f} - \frac{n\Delta f}{fN})}$$

Col. 11, equation #23 should read:

$$E_{real} + jE_{imag} = K_1 \cdot (P(k)_{real} + jP(K)_{imag}) +$$
$$k_2 \cdot (P(k)_{real} - jP(k)_{imag}) \cdot (\cos(2\Pi/N) - j\sin(2\Pi/N))$$

UNITED STATES PATENT AND TRADEMARK OFFICE
CERTIFICATE OF CORRECTION

PATENT NO. : 5,832,414
DATED : November 3, 1998
INVENTOR(S) : David G. Hart, et. al.

It is certified that error appears in the above-identified patent and that said Letters Patent is hereby corrected as shown below:

Col. 14, claim 5, line 5, equation should read:

$$f(k) = \theta * (f_n * N_n / 2\pi)$$

Signed and Sealed this

Ninth Day of March, 1999

*Attest:*

Q. TODD DICKINSON

*Attesting Officer*   *Acting Commissioner of Patents and Trademarks*